(12) United States Patent
Jung et al.

(10) Patent No.: US 9,536,742 B2
(45) Date of Patent: Jan. 3, 2017

(54) LATERAL DOUBLE-DIFFUSED MOSFET AND FABRICATION METHOD THEREOF

(71) Applicant: Semiconductor Manufacturing International (Shanghai) Corporation, Shanghai (CN)

(72) Inventors: Dae-Sub Jung, Shanghai (CN); Guohao Cao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/737,692

(22) Filed: Jun. 12, 2015

(65) Prior Publication Data

US 2015/0364598 A1    Dec. 17, 2015

(30) Foreign Application Priority Data

Jun. 12, 2014    (CN) .......................... 2014 1 0260908

(51) Int. Cl.
*H01L 21/265*    (2006.01)
*H01L 29/06*    (2006.01)
(Continued)

(52) U.S. Cl.
CPC ... *H01L 21/26586* (2013.01); *H01L 21/76224* (2013.01); *H01L 29/063* (2013.01);
(Continued)

(58) Field of Classification Search
None
See application file for complete search history.

(56) References Cited

U.S. PATENT DOCUMENTS

| | | | |
|---|---|---|---|
| 8,138,049 B2* | 3/2012 | You | H01L 27/0922 257/E29.261 |
| 2002/0079521 A1* | 6/2002 | Lin | H01L 29/402 257/288 |

(Continued)

OTHER PUBLICATIONS

Manijeh Razeghi, Fundamentals of Solid State Engineering, 2002, Kluwer Academic Publishers, pp. 410.*

(Continued)

*Primary Examiner* — Marc Armand
*Assistant Examiner* — Shannon Yi
(74) *Attorney, Agent, or Firm* — Anova Law Group, PLLC (57) ABSTRACT

The present disclosure provides a method for forming a Lateral Double-Diffused MOSFET (LDMOS). The method includes providing a semiconductor substrate having a first conductivity type; forming a first shallow trench isolation (STI) structure in the semiconductor substrate; and applying a first ion implantation to form a drift region of a second conductivity type into the semiconductor substrate with the drift region surrounding the first STI structure. The method also includes applying a counter-doping implantation to form a counter-doped region having the first conductivity in the drift region and forming a body region on one side of the drift region in the semiconductor substrate. The method further includes forming a gate structure on the semiconductor substrate, wherein one end of the gate structure extends to an area on the body region another end of the gate structure extends to an area on the first STI region.

19 Claims, 5 Drawing Sheets

(51) Int. Cl.
*H01L 21/762* (2006.01)
*H01L 29/66* (2006.01)
*H01L 29/78* (2006.01)
*H01L 29/08* (2006.01)
*H01L 29/10* (2006.01)

(52) U.S. Cl.
CPC ...... *H01L 29/0653* (2013.01); *H01L 29/0847* (2013.01); *H01L 29/66659* (2013.01); *H01L 29/7835* (2013.01); *H01L 29/1045* (2013.01)

(56) References Cited

U.S. PATENT DOCUMENTS

| | | | | |
|---|---|---|---|---|
| 2010/0163984 A1* | 7/2010 | Kim | ................ | H01L 21/82342 257/337 |
| 2011/0260247 A1* | 10/2011 | Yang | ................ | H01L 29/0653 257/343 |
| 2013/0270635 A1* | 10/2013 | Parris | ................ | H01L 29/66659 257/336 |
| 2014/0048879 A1* | 2/2014 | Qian | ................ | H01L 29/66681 257/343 |
| 2014/0138740 A1* | 5/2014 | Hu | ................ | H01L 29/66121 257/173 |
| 2014/0346597 A1* | 11/2014 | Feilchenfeld | ....... | H01L 29/7816 257/339 |
| 2015/0097265 A1* | 4/2015 | Lin | ................ | H01L 29/735 257/526 |

OTHER PUBLICATIONS

Hong Xiao, Introduction to Semiconductor Manufacturing Technology, 2007, Prentice Hall, Chapter 8.*
Nathan Cheung, Defects Tutorial, 2010.*
G. Claudio, Electrical behaviour of arsenic implanted silicon wafers at large tilt angle, 2002, IEEE, pp. 614-617.*

* cited by examiner

LATERAL DOUBLE-DIFFUSED MOSFET AND FABRICATION METHOD THEREOF

CROSS-REFERENCES TO RELATED APPLICATIONS

This application claims the priority of Chinese patent application No. CN201410260908.6, filed on Jun. 12, 2014, the entire content of which is incorporated herein by reference.

FIELD OF THE DISCLOSURE

The present disclosure generally relates to the field of semiconductor manufacturing technology and, more particularly, relates to a lateral double-diffused field-effect transistor and fabrication method thereof.

BACKGROUND

Power field-effect transistors mainly include vertical double-diffused field-effect transistors (e.g., VDMOS or vertical double-diffused MOSFETs) and lateral double-diffused field-effect transistors (e.g., LDMOS or lateral double-diffused MOSFETs). Compared to a VDMOS, an LDMOS has many advantages such as better thermal stability and frequency stability, higher gain and better durability, lower feedback capacitance and lower thermal resistance, constant input impedance, and simpler biasing circuits.

Figure 1:
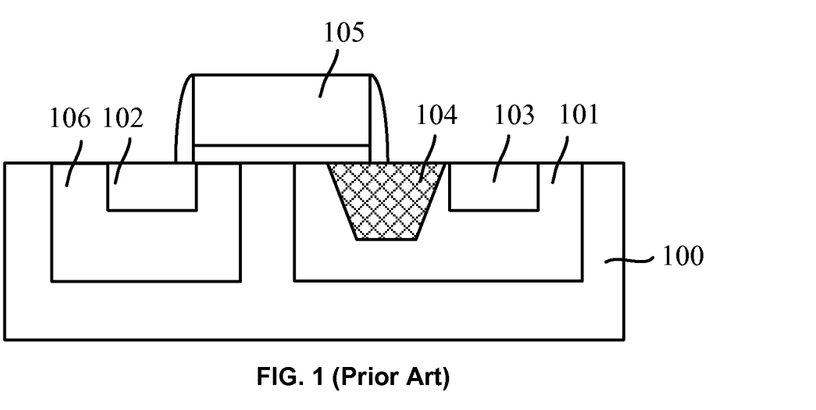
FIG. 1 illustrates a conventional N-type LDMOS.

FIG. 1 illustrates structure of a conventional N-type LDMOS. The LDMOS includes a semiconductor substrate (not shown), a P-well region 100, an N-type drift region 101 in the P-well 100, a shallow trench isolation (STI) structure 104 in the N-type drift region 101, and a P-type body region 106 on one side of the N-type drift region 101 in the P-well 100. The LDMOS also includes a gate structure 105 on the semiconductor substrate, a source region 102 in the P-type body region 106 on one side of the gate structure 105, and a drain region 103 in the N-type drift region 101 on the other side of the gate structure 105.

The shallow trench isolation (STI) structure 104 in the N-type drift region 101 of the LDMOS is configured to extend the conductive path of the LDMOS and increase the breakdown voltage of the LDMOS.

The gate structure 105 of the LDMOS includes a gate dielectric structure, a gate electrode on the gate dielectric, and sidewalls on both sides of the gate electrode and the gate dielectric. Also, the gate structure 105 extends from the P-type body region 106 to the N-type drift region 101 and partially covers the STI region 104.

The source region 102 and the drain region 103 are N-type doped. There is a need to improve performance of the conventional LDMOS devices.

BRIEF SUMMARY OF THE DISCLOSURE

One aspect of the present disclosure provides a method for forming a Lateral Double-Diffused MOSFET (LDMOS). The method provides a semiconductor substrate with a first conductivity type. A first shallow trench isolation (STI) structure in the semiconductor substrate is formed and a first ion implantation is applied to form a drift region of a second conductivity type in the semiconductor substrate with the drift region surrounding the first STI structure. The second conductivity type is opposite to the first conductivity type. In the method, a counter-doping implantation is also applied to form a counter-doped region having the first conductivity in the drift region and a body region is formed on one side of the drift region in the semiconductor substrate. The body region has the first conductivity type and a depth of the counter-doped region is less than a depth of the drift region. In the method, a gate structure is also formed on the semiconductor substrate, wherein one end of the gate structure extends to an area on the body region another end of the gate structure extends to an area on the first STI region.

Another aspect of the present disclosure provides a Lateral-Double-Diffused MOSFET (LDMOS). The LDMOS includes a semiconductor substrate having a first conductivity type; a first shallow trench isolation (STI) structure in the semiconductor substrate; and a drift region having a second conductivity type, in the semiconductor substrate and surrounding the first STI structure, wherein the second conductivity type is opposite to the first conductivity type. The LDMOS also includes a counter-doped region having the first conductivity type and in the drift region, a body region having the first conductivity type and on one side of the drift region in the semiconductor substrate, and a gate structure on the semiconductor substrate. A depth of the counter-doped region is less than a depth of the drift region. One end of the gate structure extends to an area on the body region and another end of the gate structure extends to an area on the first STI structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. For illustrative purposes, certain portion(s) in the drawings can be enlarged or reduced. Also, in actual production, dimensions of a device should include three-dimensional parameters such as length, width, and depth.

The disclosed method and device are directed to LDMOS devices with improved performance. For example, source-to-drain breakdown voltage, ON-resistance, gate-to-drain parasitic capacitance, of the disclosed LDMOS devices may be improved.

The present disclosure provides an LDMOS device and a fabrication method for forming the LDMOS. For example, after forming a drift region, a counter-doped region can be formed in the drift region. The depth of the counter-doped region can be less than the depth of the drift region. The counter-doped region can be doped with dopants of a first conductivity type, and the drift region can be doped with dopants of a second conductivity type. The first conductivity type is opposite to the second conductivity type. The formation of the counter-doped region and the drift region can form a PN junction parasitic capacitance near the surface of the semiconductor substrate. After a gate structure is formed on the semiconductor substrate and the drain region is formed in the drift region, the PN junction parasitic capacitance may be connected in series with the gate dielectric parasitic capacitance, and thus the gate-to-drain capacitance between the gate electrode and the drain region can be reduced. The dynamic loss of the LDMOS can be reduced. The breakdown resistance of the LDMOS can be increased, and the breakdown voltage of the LDMOS can be increased/improved.

Figure 11:
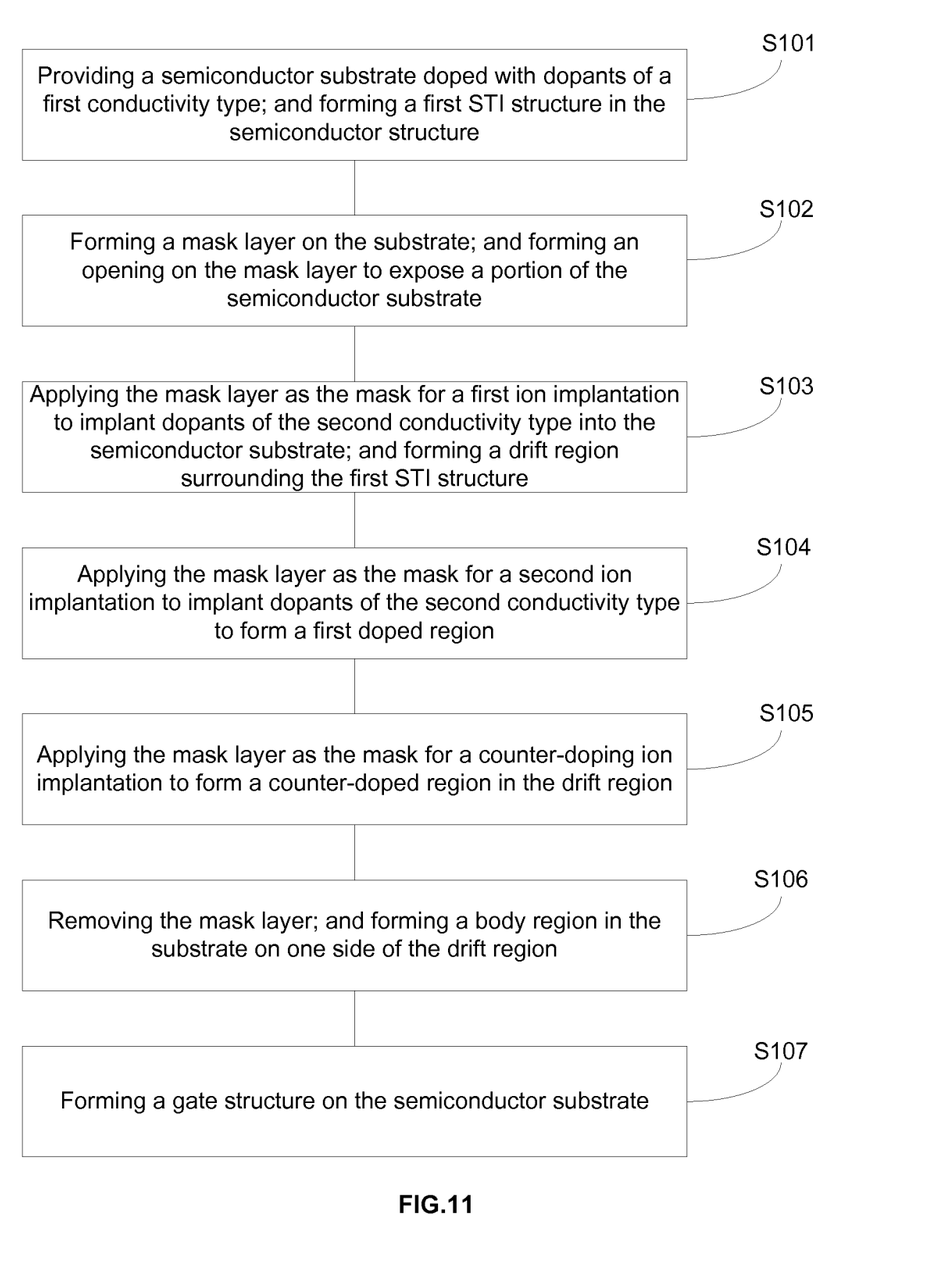
FIG. 11 illustrates an exemplary fabrication process for forming an LDMOS device consistent with various disclosed embodiments.

FIG. 11 illustrates an exemplary fabrication process for forming an LDMOS device and FIGS. 2-8 illustrate the semiconductor structures corresponding to various stages of the exemplary fabrication process.

Figure 2:
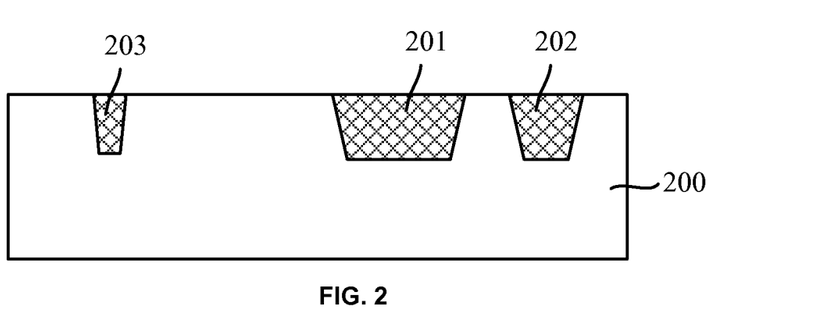
FIGS. 2-8 illustrate semiconductor structures corresponding to certain stages of an exemplary fabrication process of an LDMOS consistent with various disclosed embodiments.

As shown in FIG. 11, at the beginning of the fabrication process, a semiconductor substrate doped with dopants (i.e., or ion dopants) of a first conductivity type is provided and a first STI structure is formed in the semiconductor substrate (S101). FIG. 2 illustrates a corresponding semiconductor structure.

As illustrated in FIG. 2, a semiconductor substrate 200 doped with dopants of a first conductivity type can be provided and a first STI structure 201 can be formed in the semiconductor substrate 200.

The semiconductor substrate 200 can be used as a platform for the subsequent LDMOS formation. The semiconductor substrate 200 can be made of silicon (Si), germanium (Ge), silicon germanium (GeSi), and/or silicon carbide (SiC). The semiconductor substrate 200 can also be made of, for example, silicon-on-insulator (SOI), germanium-on-insulator (GOI), and/or other suitable materials such as III-V compounds, e.g., gallium arsenide (GaAs). In one embodiment, the semiconductor substrate 200 can be made of silicon.

The semiconductor substrate 200 can be doped with dopants of the first conductivity type, and the dopants can be P-type or N-type. Dopant type can be determined based on the type of the subsequently-formed LDMOS. For example, when an N-type LDMOS device is to be formed, the corresponding dopants of the first conductivity type can be P-type dopants. When a P-type LDMOS is to be formed, the corresponding dopants of the first conductivity type can be N-type dopants.

The P-type dopants can be one or more of boron ions, indium ions, and gallium ions. The N-type dopants can be one or more of phosphorous ions, arsenic ions, and antimony ions.

For illustrative purposes, an N-type LDMOS device is used as an example for disclosing an ion implantation process to dope the semiconductor substrate 200 with N-type dopants.

The first STI structure 201 can be formed in the semiconductor substrate 200 to extend the conductive path of the LDMOS device. The first STI structure 201 can be made of one or more of silicon dioxide, silicon nitride, and/or silicon oxynitride.

The first STI structure 201 can be formed by the following process. A patterned mask layer can be formed on the semiconductor substrate 200. The patterned mask layer can be used as an etch mask for etching the semiconductor substrate 200 and form a trench. The trench can be filled with suitable insulating materials to form the first STI structure 201.

In an embodiment, the first STI structure 201 can be single-layered or multiple-layered (i.e., the number of layers is equal to or greater than 2). In one specific embodiment, the first STI structure 201 can be a double-layered stack structure, which includes a liner layer and an insulating layer. The liner layer can be formed on the sidewall and the bottom of the trench. The insulating layer can be formed on the liner layer to fill up the trench.

The semiconductor substrate 200 may further include a second STI structure 202 to provide electrical isolation between a subsequently-formed drain region and adjacent active regions.

The semiconductor substrate 200 may further include a third STI structure 203 to provide electrical isolation between the subsequently-formed drain region and adjacent second doped region.

In various embodiments, the second STI structure 202 and the third STI structure 203 can be formed with the first STI structure 201 in the same fabrication step(s).

Figure 3:
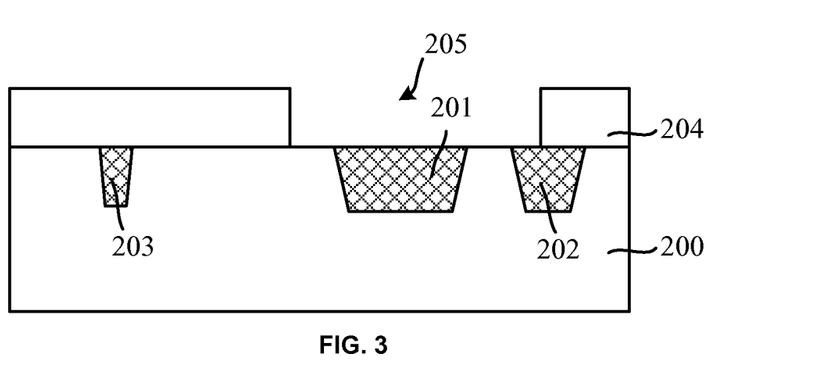

Returning to FIG. 11, after providing the semiconductor substrate with dopants of the first conductivity type and forming the first STI structure, a mask layer is formed on the semiconductor substrate, and an opening is formed to expose a portion of the semiconductor substrate 200 (S102). FIG. 3 illustrates a corresponding semiconductor structure.

As illustrated in FIG. 3, a mask layer 204 can be formed on the semiconductor substrate 200 and an opening 205 can be formed to expose a portion of the semiconductor substrate 200.

The mask layer 204 can be used as a mask to provide protection during the subsequent ion implantation process. The opening 205 of the mask layer 204 may expose a portion of the semiconductor substrate 200 for the subsequent ion implantation, where the opening 205 may correspond to the region to undergo the subsequent ion implantation process. That is, the region defined by the opening 205 corresponds to the subsequently-formed drift region.

The mask layer 204 can be made of photoresist or other appropriate materials. The opening 205 can be formed by a photolithography process (i.e., including exposure and development of the photoresist material).

Figure 4:
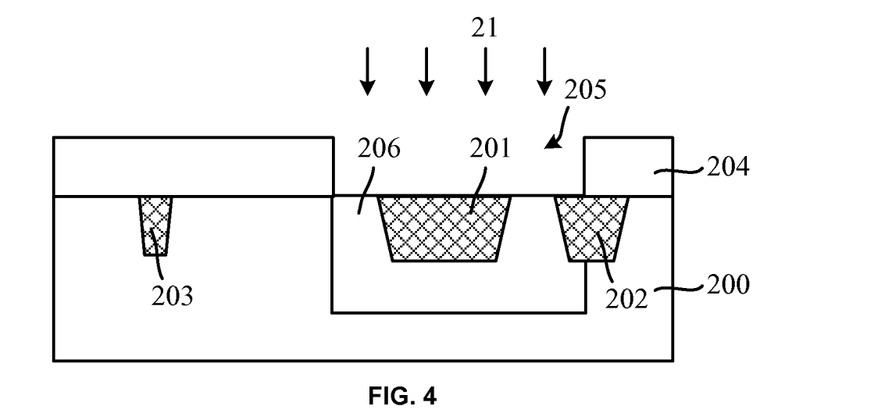

Returning to FIG. 11, after the mask layer and the opening are formed, the mask layer is used as the mask for a first ion implantation to implant dopants of the second conductivity type into the semiconductor substrate through the opening, and a drift region can be formed in the semiconductor substrate to surround the first STI structure (S103). FIG. 4 illustrates a corresponding semiconductor structure.

As illustrated in FIG. 4, the mask layer 204 can be used as the mask for a first ion implantation 21 to implant dopants of the second conductivity type into the semiconductor substrate 200 through the opening 205. A drift region 206 in the semiconductor substrate 200 can be formed to surround the first STI structure 201. The second conductivity type can be opposite to the first conductivity type.

The second conductivity type can be opposite to the first conductivity type. In one embodiment, the subsequently-formed LDMOS may be an N-type LDMOS, and the dopants of the second conductivity type being implanted can N-type dopants. The N-type dopants can be one or more of phosphorus ions, arsenic ions, and antimony ions. In one embodiment, the dopants of the second conductivity type can be phosphorus ions.

In other embodiments of the present disclosure, when the subsequently-formed LDMOS is a P-type LDMOS, the corresponding dopants of the second conductivity type being implanted can be P-type dopants. The P-type dopants can be one type or more of boron ions, indium ions, and gallium ions.

The first ion implantation 21 may include a first-step ion implantation and a second-step ion implantation. The tilt angle of the first-step ion implantation may be about 0° to about 7°, the ion implantation energy may be about 500 KeV to about 1M KeV, and the ion dose may be about 5E11 atom/cm$^2$ to about 1E13 atom/cm$^2$. The tilt angle of the second-step ion implantation may be about 0° to about 7°, the ion implantation energy may be 250 KeV to 500 KeV, and the ion dose may be about 5E11 atom/cm$^2$ to about 1E13 atom/cm$^2$.

The dopant concentration in the drift region 206 can be distributed more uniformly by using the two-step ion implantation process (i.e., the first-step ion implantation and the second-step ion implantation), and drastic increase/change of the ON-resistance near the surface of the drift region 206 can be prevented when forming the counter-doped region and the first doped region. It should be noted that the tilt angle of the ion implantation in the disclosed embodiments may represent the angle between the direction of the ion implantation and the normal line of the surface of the semiconductor substrate 200.

In one embodiment, the drift region 206 may be formed after the first STI structure 201 is formed in the semiconductor substrate 200.

In other embodiments of the present disclosure, the drift region 206 can be formed before the formation of the first STI structure 201, and the first STI structure 201 can be formed in the drift region 206. In other words, the drift region 206 can be formed before forming the first STI structure 201.

Figure 5:
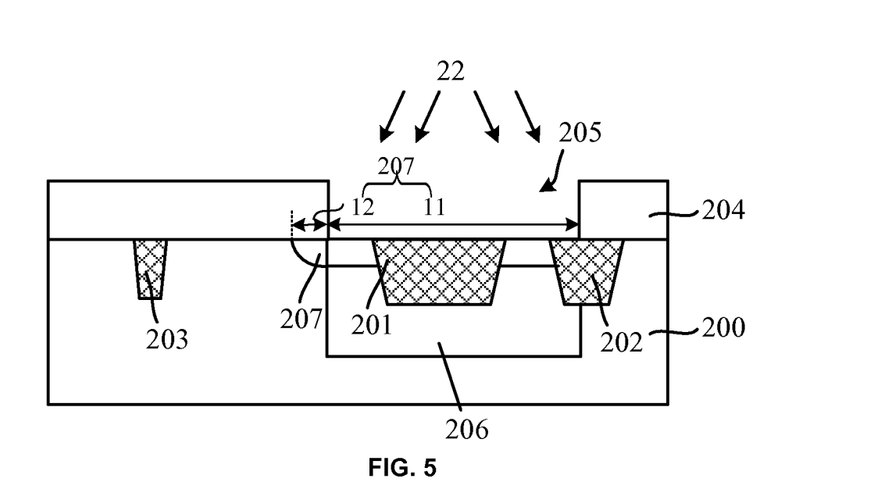

Returning to FIG. 11, after forming the drift region, the mask layer can be used as the mask for a second ion implantation to implant dopants of the second conductivity type to form a first doped region (S104). FIG. 5 illustrates a corresponding semiconductor structure.

As illustrated in FIG. 5, the mask layer 204 can used as the mask for a second ion implantation 22 to implant dopants of the second conductivity type into the semiconductor substrate 200 to form a first doped region 207 in the semiconductor substrate 200. The first doped region 207 may include connected first portion 11 and second portion 12 (i.e., a first portion 11 connected with a second portion 12). The first portion 11 may be located in the drift region 206, and the second portion 12 may be located in the semiconductor substrate 200 outside the drift region 206. The depth of the first doped region 207 may be less than the depth of the drift region 206.

The first doped region 207 and the drift region 206 can both be doped with dopants of the second conductivity type. In one embodiment, the subsequently-formed LDMOS may be an N-type LDMOS, and the dopants of the second conductivity type can be N-type dopants. The N-type dopants can be one or more of phosphorus ions, arsenic ions, and antimony ions. To maintain the relative positions between the first doped region 207 and the drift region 206 after a subsequent thermal annealing process, the relative atomic mass of the dopants of the second conductivity type in the doped region 207 may preferably be the same as the atomic mass of the dopants of the second conductivity in the drift region 206. As such, the ion diffusion rate of the dopants in the first doped region 207 and the ion diffusion rate of the dopants in the drift region 206 can be consistent/similar with one another during the thermal annealing process. In one embodiment, the dopants of the second conductivity type in the first doped region are phosphorus ions.

In other embodiments of the present disclosure, when the subsequently-formed LDMOS is a P-type LDMOS, the corresponding dopants of the second conductivity may be P-type dopants. The P-type dopants can be one or more of boron ions, indium ions, and gallium ions.

The reason of forming the first doped region 207 is described as follows. A subsequently-formed counter-doped region (formed by implanting dopants of the first conductivity type into the drift region 206), having a depth shallower than the depth of the drift region 206, can be formed in the drift region 206 and doped with dopants opposite to the dopants in the drift region 206. Because dopants in the counter-doped region and dopants in the drift region 206 have opposite conductivity types, when the LDMOS is in operation, the ON-resistance near the surface of the drift region 206 (the region overlapped by the drift region 206 and the counter-doped region) can increase drastically compared to the ON-resistance (the source-to-drain resistance when the LDMOS is on) of a conventional LDMOS. This drastic increase of ON-resistance can adversely affect the performance of the LDMOS. Therefore, in the embodiments of the present disclosure, by doping the first doped region 207 and the drift region 206 with dopants of the same type, adverse effect on the ON-resistance near the surface of the drift region 206 can be reduced/alleviated after the formation of the counter-doped region. As such, drastic increase of the ON-resistance can be prevented.

The depth of the first doped region 207 can be less than the depth of the drift region 206, and the first doped region 207 can be formed near the surface of the drift region 206 (e.g., in a top surface of the substrate 200). It should be noted that, the depth of the first doped region may refer to the vertical distance from the bottom boundary of the first doped region to the surface of the semiconductor substrate. The depth of the drift region may refer to the vertical distance from the bottom boundary of the drift region to the surface of the semiconductor substrate.

The first doped region 207 may include connected first portion 11 and second portion 12. The first portion 11 may be located in the drift region 206 and the second portion 12 may be located in the semiconductor substrate 200 outside the drift region 206. The second portion 12 may be located at least in the semiconductor substrate 200 under the subsequently-formed gate structure. The first portion 11 of the first doped region 207 may overlap with a portion of the drift region 206, and the subsequently-formed counter-doped region can be located in the region overlapped with the first doped region 207 and the drift region 206. The first portion 11 of the first doped region 207 may reduce or alleviate the adverse effect on the ON-resistance near the surface of the drift region 206 after the formation of the counter-doped region. The second portion 12 of the first doped region 207 may form a path connecting the boundary of the drift region 206 and the channel formed under the subsequently-formed gate structure to prevent adverse effect (i.e., by the counter-doped region) on the conductive path between the drift region 206 and the channel after the formation of the counter-doped region.

The second ion implantation 22 can be used to implant dopants at an angle. The angle of the second ion implantation 22 can be about 15° to about 45°, the ion implantation energy can be about 150 KeV to about 250 KeV, and the ion dose can be about 1E12 atom/cm$^2$ to about 1.5E13 atom/cm$^2$. The ion implantation energy of the second ion implantation 22 may be close to or the same as the implantation energy of the subsequent counter-doping process. After the counter-doped region is formed, the first doped region can effectively prevent the drastic increase of the ON-resistance.

The mask layer 204 can also be used as the mask for the second ion implantation 22 to improve the precision of the locations of the first doped region 207 and the drift region 206. Fabrication process can be simplified.

Figure 6:
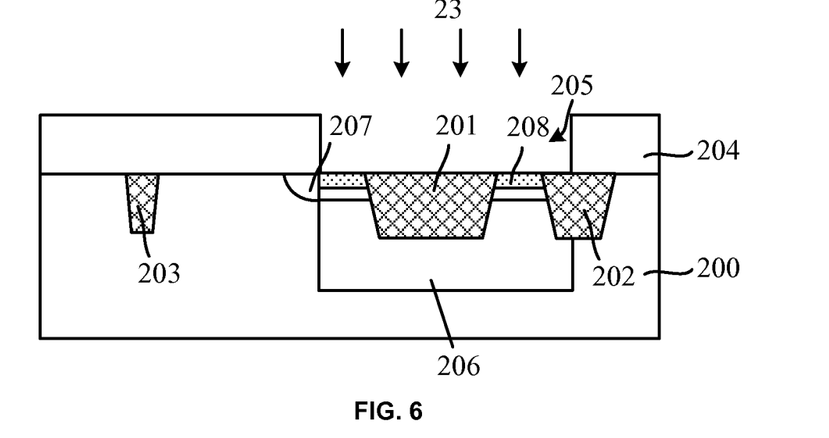

Returning to FIG. 11, after the first doped region is formed, the mask layer is used as the mask for a counter-doping implantation to form a counter-doped region in the drift region (S105). FIG. 6 illustrates a corresponding semiconductor structure.

As illustrated in FIG. 6, the mask layer 204 is used as the mask for the counter-doping ion implantation 23 to form a counter-doped region 208 in the drift region 206. Dopants of the first conductivity type can be implanted into the drift region 206 through the opening 205 to form the counter-doped region 208 in the drift region 206. The depth of the counter-doped region 208 is less than the depth of the drift region 206 and the first doped region 207.

The counter-doped region 208 may be doped with dopants of the first conductivity, opposite to the conductivity types of the dopants in the drift region 206. In one embodiment, when the subsequently-formed LDMOS is an N-type LDMOS, the dopants of the first conductivity type may be P-type dopants. The P-type dopants can be one or more of boron ions, indium ions, and gallium ions.

During the subsequent thermal annealing process, to ensure that the counter-doped region 208 remains in the drift region 206 and the depth of the counter-doped region 208 remains less than the depth of the first doped region 207, it is preferable that the dopants of the first conductivity type in the counter-doped region 208 have greater relative atomic mass than the dopants of the second conductivity type in the first doped region 207 (or the drift region 206). Thus, during the subsequent thermal annealing process, the diffusion rate of the dopants of the first conductivity type in the counter-doped region 208 is less than the diffusion rate of the dopants of the second conductivity type in the first doped region 207 (or the drift region 206). In one embodiment, the dopants of the first conductivity type in the counter-doped region 208 are indium ions and/or gallium ions.

In other embodiments of the present disclosure, when the subsequently-formed LDMOS is a P-type LDMOS, the dopants of the second conductivity type may be N-type dopants. The N-type dopants can be one type or more of phosphorus ions, arsenic ions, and antimony ions.

By forming the counter-doped region 208, having dopants of opposite conductivity type of the drift region 206, a PN junction parasitic capacitance may be formed near the surface of the semiconductor substrate 200. The PN junction parasitic capacitance can be connected in series with the gate dielectric parasitic capacitance when forming the gate structure (including the gate dielectric and the gate electrode) and the drain region (in the drift region) in subsequent steps. Thus, the gate-to-drain capacitance between the gate electrode and the drain region can be reduced, and dynamic loss of the LDMOS in operation can be reduced.

In addition, by forming the counter-doped region 208, having dopants of the opposite conductivity type of the dopants of the drift region 206, the breakdown resistance (the source-to-drain resistance of LDMOS at breakdown) can be increased such that the source-to-drain breakdown voltage of the LDMOS can be increased. Further, since the depth of the counter-doped region 208 is less than the depth of the drift region 206 and the depth of the first doped region 207, respectively, only the resistance near the surface of the drift region 206 can be increased. Resistance of other regions of the drift region 206 may not be affected.

If the ion dose of the counter-doping ion implantation is too low, the counter-doped region 208 may play a minor role in reducing the gate dielectric parasitic capacitance. If the ion dose of the counter-doping ion implantation is too high, the counter-doped region 208 may play a greater role in affecting the ON-resistance and the electrical properties of the drift region and the formed first doped region 207 may only have limited effect in preventing the drastic increase of the ON-resistance. In one embodiment, the tilt angle of the counter-doping ion implantation 23 may be about 0° to about 7°, the ion implantation energy may be about 30 KeV to about 100 KeV, and the ion dose may be about 1E12 atom/cm$^2$ to about 1.5E13 atom/cm$^2$. By combining/adjusting the depths and dopant concentrations of the counter-doped region 208, the drift region 206 and the first doped region 207, the gate dielectric parasitic capacitance of the LDMOS can be reduced. Meanwhile, the ON-resistance of the LDMOS may not undergo a drastic increase, and the performance of the LDMOS can be improved.

The mask layer 204 can also be used as the mask for the counter-doing ion implantation 23 to ensure precise relative positions between the counter-doped region 208, the drift region 206, and the first doped region 207.

The counter-doping ion implantation 23 can be performed once or more than once (equal to or greater than 2 times).

After counter-doped region 208 is formed, a thermal annealing process can be performed on the counter-doped region 208, the first doped region 207, and the drift region 206, to activate the dopants in the counter-doped region 208, the first doped region 207, and the drift region 206.

The temperature of the thermal annealing process can be about 800° C. to about 1500° C., and the process duration of the thermal annealing process can be about 10 to about 120 seconds.

In other embodiments of the present disclosure, the thermal annealing process can also be performed after the formation of the source region and the drain region.

Figure 7:
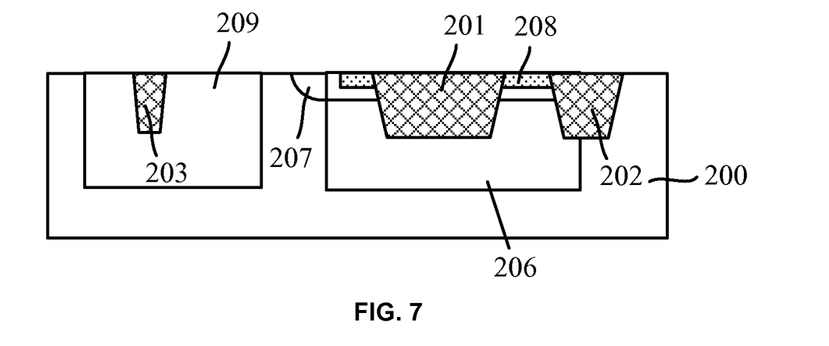

Returning to FIG. 11, after the counter-doped region is formed, the mask layer is removed and a body region is formed in the semiconductor substrate on one side of the drift region (S106). FIG. 7 illustrates a corresponding semiconductor structure.

As illustrated in FIG. 7, the mask layer 204 (as illustrated in FIG. 6) can be removed and a body region 209 can be formed in the semiconductor substrate 200 on one side of the drift region 206. The body region 209 may be doped with dopants of the first conductivity type.

The body region 209 can be formed by an ion implantation process. In one embodiment, when the subsequently-formed LDMOS is an N-type LDMOS, the dopants of the first conductivity type in the body region 209 may be P-type dopants. The P-type dopants can be one or more of boron ions, indium ions, and gallium ions.

In other embodiments of the present disclosure, when the subsequently-formed LDMOS is a P-type LDMOS, the dopants of the first conductivity type in the body region 209 may be N-type dopants. The N-type dopants can be one or more of phosphorus ions, arsenic ions, and antimony ions.

Figure 8:
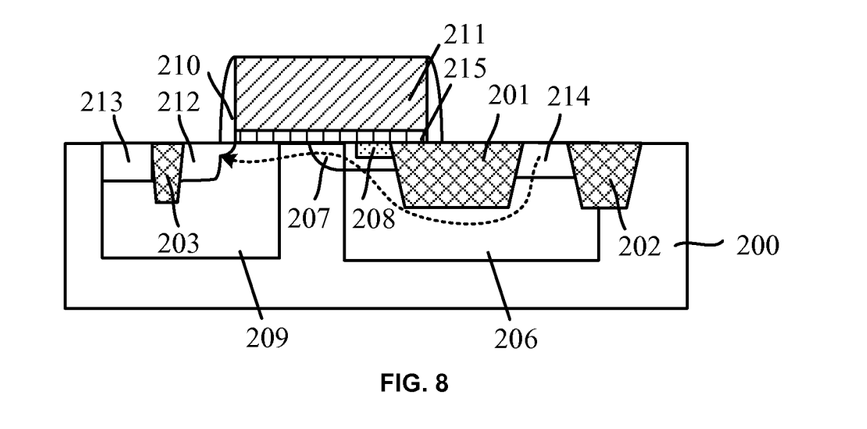

Returning to FIG. 11, after the body region is formed, a gate structure may is formed on the semiconductor substrate (S107). FIG. 8 illustrates a corresponding semiconductor structure.

As illustrated in FIG. 8, a gate structure may be formed on the semiconductor substrate 200. One end of the gate structure may extend to the area on the body region 209, and the other end of the gate structure may extend to the area on the STI structure 201.

The gate structure may include a gate dielectric 215 on the semiconductor substrate 200, a gate electrode 211 on the gate dielectric 215, and sidewalls 210 on both sides of the gate electrode 211 and the gate dielectric 215.

The gate dielectric layer 215 can be made of silicon dioxide, and the gate electrode 211 can be made of polysilicon. In other embodiments of the present disclosure, the gate dielectric layer 215 can be made of high-K materials such as $HfO_2$, $TiO_2$, HfZrO, HfSiNO, $Ta_2O_5$, $ZrO_2$, $ZrSiO_2$, $Al_2O_3$, $SrTiO_3$ and/or BaSrTiO. The gate electrode 211 can be made of metals such as W, Al, Cu, Ti, Ag, Au, Pt, and/or Ni. The gate structure can be formed by a gate-last process.

After the gate structure is formed (i.e., after the formation of a dummy gate in the gate-last process), a drain region 214 can be formed in the drift region 206. The drain region 214 can be formed in the drift region 206 on one side of the STI structure 201 facing away from the gate structure. The drain region 214 may be doped with dopants of the second conductivity type. A source region 212 may be formed in the body region 209 on one side of the gate structure. The source region 212 may be doped with dopants of the second conductivity type.

The drain region 214 may be located in the drift region 206 between the first STI structure 201 and the second STI structure 202. The depth of the drain region 214 may be greater than the depth of the counter-doped region 208 but less than the depth of the drift region 206. The source region 212 may be located in the body region 209 between the third STI structure 203 and the gate structure.

In one embodiment, the subsequently-formed LDMOS is may be an N-type LDMOS, and the dopants of the second conductivity type in the drain region 214 and the source region 212 may be N-type dopants. The N-type dopants can be one or more of phosphorus ions, arsenic ions, and antimony ions.

In other embodiments of the present disclosure, when the subsequently-formed LDMOS is a P-type LDMOS, the dopants of the second conductivity type in the drain region 214 and the source region 212 may be P-type dopants. The P-type dopants can be one type or more of boron ions, indium ions, and gallium ions.

The method for forming the LDMOS may further include forming a second doped region 213 in the body region 209. The second doped region may be located in the body region 209 on one side of the third STI structure 203 facing away from the gate structure. The dopants in the second doped region 213 may be of the same conductivity type as the dopants in the body region 209.

After the formation of the second doped region 213, the drain region 214, and the source region 212, the method for forming the LDMOS may further include a thermal annealing process to activate the dopants.

In one embodiment, the dash line in FIG. 8 may represent the electrical current flow path when the LDMOS is in operation. The current may flow from the drain region 214, through the drift region 206, the boundary shared by the first doped region 207 and the drift region 206, the second portion of the first doped region 207, the channel formed in the semiconductor substrate 200 and part of the body region 209 under the gate structure, and reach the source region 212.

As illustrated in FIG. 8, the present disclosure further provides an LDMOS. The LDMOS may include a semiconductor substrate 200, a first STI structure 201 in the semiconductor substrate 200, a drift region 206 in the semiconductor substrate 200 doped with dopants of a second conductivity type. The LDMOS may also include a counter-doped region 208 formed in the drift region 206 with a depth less than the depth of the drift region 206, a body region 209 formed on one side of the drift region 206, and a gate structure formed on the semiconductor substrate 200.

The semiconductor substrate 200 can be doped with dopants of a first conductivity type. The drift region 206 can surround the first STI structure 201. The counter-doped region 208 can be doped with dopants of the first conductivity type. The second conductivity type may be opposite to the first conductivity type. The body region 209 can be doped with dopants of the first conductivity type. One end of the gate structure may extend to the area on the body region 209, and the other end of the gate structure may extend to the area on the first STI structure 201.

The LDMOS may further include a first doped region 207 in the semiconductor substrate 200, doped with dopants of the second conductivity type. The first doped region 207 may include connected first portion and second portion. The first portion may be located in the drift region 206 and the second portion may be located in the semiconductor substrate 200 outside the drift region 206. The depth of the first doped region 207 may be less than the depth of the drift region 206 but greater than the depth of the counter-doped region 208.

The LDMOS may further include a drain region 214 formed in the drift region 206 on one side of the first STI structure 201 facing away from the gate structure, and a second STI structure 202 formed in the semiconductor substrate 200 on one side of the drain region 214 facing away from the gate structure. The LDMOS may also include a third STI structure 203 formed in the body region 209, and a source region 212 formed between the third STI structure 203 and the gate structure and doped with dopants of the second conductivity type. The LDMOS may further include a second doped region 213 formed in the body region 209 on one side of the third STI structure 203 facing away from the gate structure.

The drain region 214 may be located on one side of the first STI region 201 facing away from the gate structure, and doped with dopants of the second conductivity type. The second doped region 213 and the body region 209 can be doped with dopants of the same conductivity type.

The concentration of the dopants of the first conductivity type in the counter-doped region 208 can be about 1E12 atom/$cm^3$ to about 1.5E13 atom/$cm^3$. The concentration of the dopants of the second conductivity type in the first doped region 207 can be about 1E12 atom/$cm^3$ to about 1.5E13 atom/$cm^3$. The concentration of the dopants of the second conductivity type in the drift region 206 can be about 5E11 atom/$cm^3$ to about 1E13 atom/$cm^3$. The LDMOS may be an N-type LDMOS, and the dopants of the first conductivity may be P-type dopants. The dopants of the second conductivity type may be N-type dopants.

The LDMOS may be a P-type LDMOS, and the dopants of the first conductivity can be N-type dopants. The dopants of the second conductivity type may be P-type dopants.

It should be noted that other limitations and descriptions of the LDMOS can be referred to corresponding description of the fabrication process of the LDMOS aforementioned, and is not repeated herein.

Figure 9:
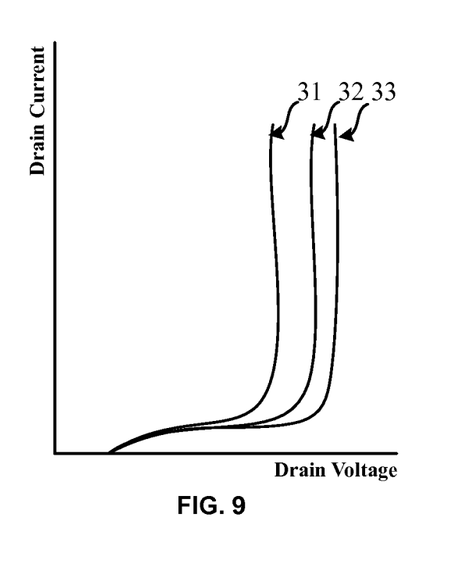
FIG. 9 compares drain-to-source breakdown characteristics between exemplary LDMOS and a conventional LDMOS.

FIG. 9 illustrates a comparison of the drain-to-source breakdown characteristics between disclosed LDMOS devices and a conventional LDMOS. The x-axis may represent the drain bias (or source-to-drain breakdown voltage) in a drain-to-source breakdown test, and the y-axis may represent the drain current (or source-to-drain breakdown current) in a drain-to-source breakdown test. Curve 31 may represent the breakdown characteristics of a conventional LDMOS (no counter-doping implantation in the drift region), curve 32 may represent the breakdown characteristics of an embodiment of the LDMOS in the present disclosure (one counter-doping implantation in the drift region), and curve 33 may represent the breakdown characteristics of another embodiment of the LDMOS in the present disclosure (two or more counter-doping implantations in the drift region). As shown in FIG. 9, the source-to-drain breakdown voltage of the LDMOS provided by the present disclosure can be improved (i.e., having a higher source-to-drain breakdown voltage) compared to the source-to-drain breakdown voltage of the conventional LDMOS.

Figure 10:
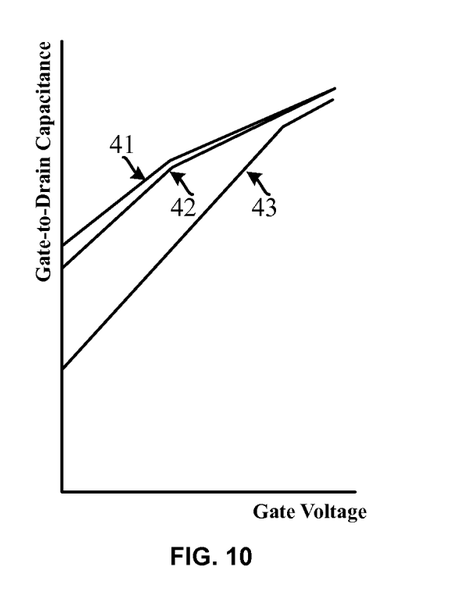
FIG. 10 compares gate-to-drain parasitic capacitance between exemplary LDMOS and a conventional LDMOS.

FIG. 10 compares the gate-to-drain parasitic capacitances between disclosed LDMOS devices and a conventional LDMOS. The x-axis may represent the gate bias when the LDMOS is in the on-state, and the y-axis may represent the gate-to-drain parasitic capacitance measured at a particular gate bias. Curve 41 may represent the gate-to-drain parasitic capacitance of a conventional LDMOS (no counter-doping in the drift region), curve 42 may represent an embodiment of the LDMOS in the present disclosure (one counter-doping implantation in the drift region), and curve 43 may represent another embodiment of the LDMOS in the present disclosure (two or more counter-doping implantations in the drift region). It can be shown from FIG. 10 that at a particular gate bias, the gate-to-drain capacitance formed in the LDMOS provided by the present disclosure can be improved (i.e., having a lower gate-to-drain capacitance) compared to the gate-to-drain capacitance formed in a conventional LDMOS.

The LDMOS provided by the present disclosure has the several advantages. For example, according to the fabrication method of the LDMOS provided by the present disclosure, after the formation of the drift region, the counter-doped region can be formed in the drift region. The depth of the counter-doped region may be less than the depth of the drift region. The counter-doped region can be doped with dopants of the first conductivity type, and the drift region can be doped with dopants of the second conductivity type. The first conductivity type is opposite to the second conductivity type. The formation of the counter-doped region and the drift region can further form a PN junction parasitic capacitance near the surface of the semiconductor substrate. After the gate structure (including the gate dielectric and the gate electrode) is formed on the semiconductor substrate and the drain region is formed in the drift region, the PN junction parasitic capacitance becomes connected in series with the gate dielectric parasitic capacitance, and thus the gate-to-drain capacitance between the gate electrode and the drain region can be reduced. The dynamic loss of the LDMOS can be reduced.

In addition, the counter-doped region enables an increased breakdown resistance of the LDMOS, and the breakdown voltage of the LDMOS can be increased.

Further, the first doped region can be formed by doping the semiconductor substrate with dopants of the second conductivity type. The first doped region includes connected first portion and second portion, where the first portion is located in the drift region, and the second region is located in the semiconductor substrate outside the drift region. The depth of the first doped region is less than the depth of the drift region but greater than the depth of the counter-doped region. By forming the first doped region with the same doping type as the drift region, adverse effect on the ON-resistance near the surface or the drift region, caused by the formation of the counter-doped region, can be reduced. Also, drastic increase of the ON-resistance can be prevented. The ON-resistance of the disclosed LDMOS may remain consistent with or have little changes compared to the ON-resistance of the LDMOS of a conventional LDMOS. In addition, the second portion of the first doped region can form a path connecting the edge of the drift region and channel region under the bottom of the gate structure, to prevent adverse effect on the conductive path between the drift region and the channel region, after the formation of the counter-doped region. The electrical current can flow through the conductive path smoothly.

In the LDMOS provided by the present disclosure, the counter-doped region, formed in the drift region, may be doped with dopants of opposite conductivity type of the drift region. The breakdown resistance of the LDMOS can be increased/improved, and the breakdown voltage of the LDMOS can be increased/improved.

Furthermore, the disclosed LDMOS may further include a first doped region in the semiconductor substrate, doped with dopants of a second conductivity type. The first doped region may include connected first portion and second portion, where the first portion is located in the drift region, and the second portion is located in the semiconductor substrate outside the drift region. The depth of the first doped region is less than the depth of the drift region but greater than the depth of the counter-doped region. The doping concentration of dopants of the first conductivity type in the counter-doped region can be about $1E12$ atom/cm$^3$ to about $1.5E13$ atom/cm$^3$, the doping concentration of dopants of the second conductivity type in the first doped region can be about $1E12$ atom/cm$^3$ to about $1.5E13$ atom/cm$^3$, and the doping concentration of the dopants of the second conductivity type in the drift region can be about $5E11$ atom/cm$^3$ to about $1E13$ atom/cm$^3$. By combining/adjusting doping concentrations and depths, the gate-to-drain parasitic capacitance of the LDMOS can be reduced. Meanwhile, drastic increase of the ON-resistance of the LDMOS can be prevented. Therefore, the performance of the LDMOS can be improved.

Other applications, advantages, alternations, modifications, or equivalents to the disclosed embodiments are obvious to those skilled in the art.

What is claimed is:

1. A method for forming a Lateral Double-Diffused MOSFET (LDMOS), comprising:
   providing a semiconductor substrate having a first conductivity type;
   forming a first shallow trench isolation (STI) structure in the semiconductor substrate;
   applying a first ion implantation using a mask on the semiconductor substrate to form a drift region of a second conductivity type into the semiconductor substrate with the drift region surrounding the first STI structure, wherein the second conductivity type is opposite of the first conductivity type;

applying a second ion implantation using the same mask to form a first doped region in the semiconductor substrate such that the first doped region includes a first portion and a second portion that are connected, wherein the first portion is located in the drift region surrounding the STI structure, the second portion is located in the semiconductor substrate outside the drift region and under a gate structure to be subsequently formed, and a depth of the first doped region is less than a depth of the drift region;

applying a counter-doping implantation using the same mask to form a counter-doped region surrounding the STI structure and having the first conductivity in the drift region, wherein a depth of the counter-doped region is less than the depth of the drift region;

after forming the counter-doped region, forming a body region on one side of the drift region in the semiconductor substrate, wherein the body region has the first conductivity type; and forming the gate structure on the semiconductor substrate, wherein one end of the gate structure extends to an area on the body region another end of the gate structure extends to an area on the first STI region.

2. The method according to claim 1, wherein:
the first doped region is doped with dopants of the second conductivity.

3. The method according to claim 1, wherein the LDMOS is an N-type LDMOS, the dopants of the first conductivity type are P-type dopants, and the dopants of the second conductivity type are N-type dopants.

4. The method according to claim 1, wherein the LDMOS is a P-type LDMOS, the dopants of the first conductivity type are N-type dopants, and the dopants of the second conductivity type are P-type dopants.

5. The method according to claim 1, further including:
forming a drain region in the drift region on one side of the first STI structure facing away from the gate structure and doped with dopants of the second conductivity type, the drain region overlapping with a portion of the counter-doped region on the one side of the first STI structure facing away from the gate structure; and forming a source region in the body region on one side facing the gate structure and doped with dopants of the second conductivity type.

6. The method according to claim 1, wherein the gate structure includes a gate dielectric on the semiconductor substrate, a gate electrode on the gate dielectric, and sidewalls on both sides of the gate electrode and the gate dielectric.

7. The method according to claim 2, wherein the depth of the counter-doped region is less than the depth of the first doped region.

8. The method according to claim 2, wherein a formation process of the drift region includes:
forming a mask layer having an opening to expose a portion of the semiconductor substrate; and
applying the mask layer as the same mask for the first ion implantation to dope dopants of the second conductivity type into the semiconductor substrate to form the drift region to surround the first STI structure.

9. The method according to claim 3, wherein the P-type dopants are one or more of boron ions, indium ions, and gallium ions, and the N-type dopants are one or more of phosphorus ions, arsenic ions, and antimony ions.

10. The method according to claim 5, wherein a depth of the drain region is greater than the depth of the counter-doped region.

11. The method according to claim 7, wherein a tilt angle of the second ion implantation is about 15° to about 45°, an ion implantation energy is about 150 KeV to about 250 KeV, and an ion dose is about 1E12 atom/cm$^2$ to about 1.5E13 atom/cm$^2$.

12. The method according to claim 7, wherein a tilt angle of the counter-doping ion implantation is about 0° to about 7°, an ion implantation energy is about 30 KeV to about 100 KeV, and an ion dose is about 1E12 atom/cm$^2$ to about 1.5E13 atom/cm$^2$.

13. The method according to claim 7, wherein the first ion implantation further includes a first-step ion implantation and a second-step ion implantation, wherein:
a tilt angle of the first-step ion implantation is about 0° to about 7°, an ion implantation energy is about 500 KeV to about 1M KeV, and an ion dose is about 5E11 atom/cm$^2$ to about 1E13 atom/cm$^2$; and
a tilt angle of the second-step ion implantation is about 0° to about 7°, an ion implantation energy is about 250 KeV to about 500 KeV, and an ion dose is about 5E11 atom/cm$^2$ to about 1E13 atom/cm$^2$.

14. The method according to claim 8, wherein formation processes of the first doped region and the counter-doped region include:
applying the mask layer as the same mask for the second ion implantation to dope dopants of the second conductivity into the semiconductor substrate to form the first doped region, wherein the first doped region includes the connected first portion and second portion, the first portion is located in the drift region, the second region is located in the semiconductor substrate outside the drift region and under the gate structure, and the depth of the first doped region is less than the depth of the drift region;
applying the mask layer as the same mask for the counter-doping ion implantation to dope dopants of the first conductivity type into the drift region to form the counter-doping region having a depth less than the depth of the drift region.

15. An LDMOS (Lateral-Double-Diffused MOSFET), comprising:
a semiconductor substrate having a first conductivity type;
a first shallow trench isolation (STI) structure in the semiconductor substrate;
a drift region having a second conductivity type, in the semiconductor substrate and surrounding the first STI structure, wherein the second conductivity type is opposite of the first conductivity type;
a counter-doped region having the first conductivity type and in the drift region, the counter-doped region being partially located under a gate structure and surrounding the STI structure, wherein a depth of the counter-doped region is less than a depth of the drift region;
a first doped region in the semiconductor substrate having the second conductivity type, the first doped region including a first portion and a second portion that are connected, the first portion being located in the drift region surrounding the STI structure, the second portion being located in the semiconductor substrate outside the drift region and under a gate structure to be subsequently formed, and a depth of the first doped region being greater than the depth of the counter-doped region and less than the depth of the drift region;

a body region having the first conductivity type and on one side of the drift region in the semiconductor substrate; and the gate structure on the semiconductor substrate, wherein one end of the gate structure extends to an area on the body region and another end of the gate structure extends to an area on the first STI structure.

16. The LDMOS according to claim 15, wherein a doping concentration of the dopants of the first conductivity type is about 1E12 atom/cm3 to about 1.5E13 atom/cm3 in the counter-doped region; a doping concentration of the dopants of the second conductivity type is about 1E12 atom/cm3 to about 1.5E13 atom/cm3 in the first doped region; and a doping concentration of the dopants of the second conductivity type is about 5E11 atom/cm3 to about 1E13 atom/cm3 in the drift region.

17. The LDMOS according to claim 15, wherein the LDMOS is an N-type LDMOS, the dopants of the first conductivity type are P-type dopants, and the dopants of the second conductivity type are N-type dopants.

18. The LDMOS according to claim 15, wherein the LDMOS is a P-type LDMOS, the dopants of the first conductivity type are N-type dopants, and the dopants of the second conductivity type are P-type dopants.

19. The LDMOS according to claim 15, wherein the LDMOS is one of an N-type LDMOS and a P-type LDMOS.

* * * * *